United States Patent
Liu et al.

(10) Patent No.: US 11,164,946 B2
(45) Date of Patent: Nov. 2, 2021

(54) MANUFACTURING METHOD FOR FLASH DEVICE

(71) Applicant: CSMC TECHNOLOGIES FAB2 CO., LTD., Jiangsu (CN)

(72) Inventors: Tao Liu, Jiangsu (CN); Zhibin Liang, Jiangsu (CN); Song Zhang, Jiangsu (CN); Yan Jin, Jiangsu (CN); Dejin Wang, Jiangsu (CN)

(73) Assignee: CSMC TECHNOLOGIES FAB2 CO., LTD., Jiangsu (CN)

(*) Notice: Subject to any disclaimer, the term of this patent is extended or adjusted under 35 U.S.C. 154(b) by 0 days.

(21) Appl. No.: 16/461,721

(22) PCT Filed: Dec. 14, 2017

(86) PCT No.: PCT/CN2017/116192
§ 371 (c)(1),
(2) Date: May 16, 2019

(87) PCT Pub. No.: WO2018/121279
PCT Pub. Date: Jul. 5, 2018

(65) Prior Publication Data
US 2019/0363164 A1   Nov. 28, 2019

(30) Foreign Application Priority Data
Dec. 29, 2016   (CN) .......................... 201611249139.5

(51) Int. Cl.
*H01L 29/423* (2006.01)
*H01L 21/28* (2006.01)
(Continued)

(52) U.S. Cl.
CPC .. *H01L 29/40114* (2019.08); *H01L 29/42324* (2013.01); *H01L 29/66825* (2013.01);
(Continued)

(58) Field of Classification Search
None
See application file for complete search history.

(56) References Cited

U.S. PATENT DOCUMENTS 5,858,840 A * 1/1999 Hsieh ................ H01L 29/42324
257/E21.422
5,970,371 A   10/1999 Hsieh et al.
(Continued)

FOREIGN PATENT DOCUMENTS

CN   1979812   6/2007
CN   101170065   4/2008
(Continued)

OTHER PUBLICATIONS

International Search Report issued for International Patent Application No. PCT/CN2017/116192, dated Mar. 19, 2018, 6 pages including English translation.

*Primary Examiner* — Steven B Gauthier
(74) *Attorney, Agent, or Firm* — Hamre, Schumann, Mueller & Larson, P.C.

(57) ABSTRACT

A manufacturing method for a flash device. A manufacturing method for a flash device, comprising: providing a substrate; forming sequentially, on the substrate, a floating gate (FG) oxide layer, an FG polycrystalline layer, and an FG mask layer; etching, at the FG location region, the FG polycrystalline layer and the FG mask layer, forming a window on the FG mask layer, and forming a trench on the FG polycrystalline layer, the window being communicated with the trench; performing second etching of the side wall of the window of the FG mask layer, enabling the width of the trench located on the FG polycrystalline layer to be less than the width of the secondarily-etched window located on the FG mask layer; and oxidizing the FG polycrystalline layer, (Continued)

enabling the oxide to fill the trench to form a field oxide layer; and etching an FG having sharp angles.

12 Claims, 7 Drawing Sheets

(51) Int. Cl.
*H01L 29/66* (2006.01)
*H01L 27/11517* (2017.01)
*H01L 29/788* (2006.01)

(52) U.S. Cl.
CPC ......... *H01L 21/28* (2013.01); *H01L 27/11517* (2013.01); *H01L 29/42376* (2013.01); *H01L 29/788* (2013.01)

(56) References Cited

U.S. PATENT DOCUMENTS

| | | | | |
|---|---|---|---|---|
| 2002/0187608 | A1* | 12/2002 | Tseng | H01L 29/40114 |
| | | | | 438/257 |
| 2004/0092077 | A1* | 5/2004 | Chen | H01L 29/511 |
| | | | | 438/357 |
| 2006/0076605 | A1 | 4/2006 | Chen et al. | |
| 2009/0186474 | A1 | 7/2009 | Watanabe et al. | |
| 2016/0293618 | A1* | 10/2016 | Namkoong | H01L 27/11521 |

FOREIGN PATENT DOCUMENTS

| | | |
|---|---|---|
| CN | 102104044 | 6/2011 |
| CN | 103839795 | 6/2014 |
| CN | 104051346 | 9/2014 |
| CN | 106206451 | 12/2016 |
| JP | H1174384 | 3/1999 |

* cited by examiner

Sharp angle

MANUFACTURING METHOD FOR FLASH DEVICE

TECHNICAL FIELD

The present disclosure relates to semiconductor technologies, and in particular to methods for manufacturing a flash memory device.

BACKGROUND

Due to the high degree of integration and the fast programming capability based on channel hot electron injection (CHI, Channel Hot Injection) mechanism, Flash memory (Flash) is widely used in non-volatile memory (NVM). As shown in FIG. 1a below; an erase principle of an SST type flash memory (Flash) is through the discharge sharp angle of a floating gate (FG) closing to a control gate (CG), under the discharging principle of the discharge sharp angle of the FG, the electrons charged in the FG are released under the applied voltage. The sharper the discharge sharp angle of the floating gate, the larger the electric field between the floating gate and the control gate, and the faster the erasing speed of the flash memory.

In the conventional process of fabricating the floating gate, an oxidation window is etched out of the floating gate mask layer, the depth of the oxidation window is the thickness of the floating gate mask layer, and at the window, the floating gate polycrystalline layer is oxidized to form a silicon dioxide layer. Since the floating gate polycrystalline layer at the window is planar, a bordering surface between where the floating gate polycrystalline layer is oxidized and where the floating gate polycrystalline layer is not oxidized is a circular arc surface during the oxidation process. When the floating gate polycrystalline layer located outside the window is removed to form the floating gate, the degrees of the sharp angle of the floating gate is large, and the erasing speed and efficiency are greatly compromised. Also, in the process of forming the floating gate by removing the floating gate polycrystalline layer located outside the window to form the floating gate, an offset may occur so that the discharge sharp angle of the floating gate changes from $\beta$ to $\beta'$, as shown in FIG. 1b, the discharge sharp angle becomes more obtuse, the erasing speed and efficiency are greatly compromised, and the stability thereof is unfavorable.

SUMMARY

Accordingly, it is necessary to provide a method for manufacturing a flash memory device with small offset and sharper discharge sharp angles.

A method of manufacturing a flash memory device includes:
 providing a substrate;
 forming a floating gate oxide layer, a floating gate polycrystalline layer, and a floating gate mask layer sequentially on the substrate;
 etching the floating gate polycrystalline layer and the floating gate mask layer at a floating gate location region, forming a window in the floating gate mask layer and forming a trench in the floating gate polycrystalline layer, wherein the window is in communication with the trench;
 second-etching a sidewall of the window of the floating gate mask layer, so that a width of the trench in the floating gate polycrystalline layer is less than a width of the window in the floating gate mask layer after the second-etching;
 oxidizing the floating gate polycrystalline layer, such that the trench is filled up with oxide to form a field oxide layer; and
 etching to form a floating gate with a sharp angle.

Details of one or more embodiments of the disclosure will be introduced in the drawings and descriptions as follows. And other characteristics, purposes and advantages of the present disclosure will be apparent from the specification, drawings and appended claims

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Embodiments of the application are described more fully hereinafter with reference to the accompanying drawings. The various embodiments of the application may, however, be embodied in many different forms and should not be construed as limited to the embodiments set forth herein. Rather, these embodiments are provided so that this disclosure will be thorough and complete, and will fully convey the scope of the application to those skilled in the art.

In an embodiment, the method of manufacturing a flash memory device includes the following steps.

In step S210, a substrate is provided.

Figure 1A:
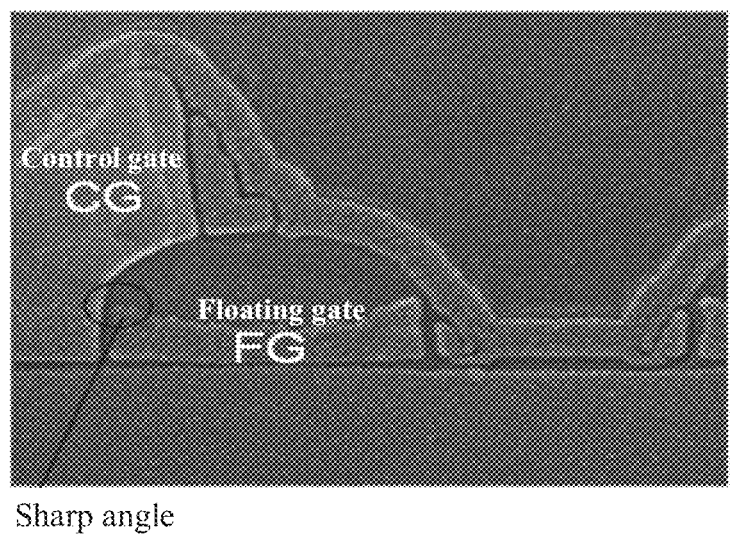
FIG. 1a is an enlarged view of a microstructure of a conventional floating gate.
Figure 1B:
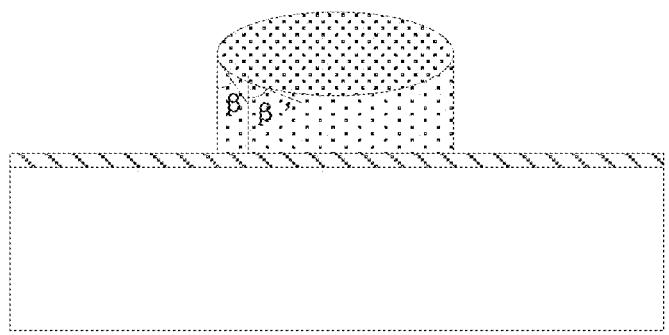
FIG. 1b is a schematic view of a conventional floating gate.
Figure 2:
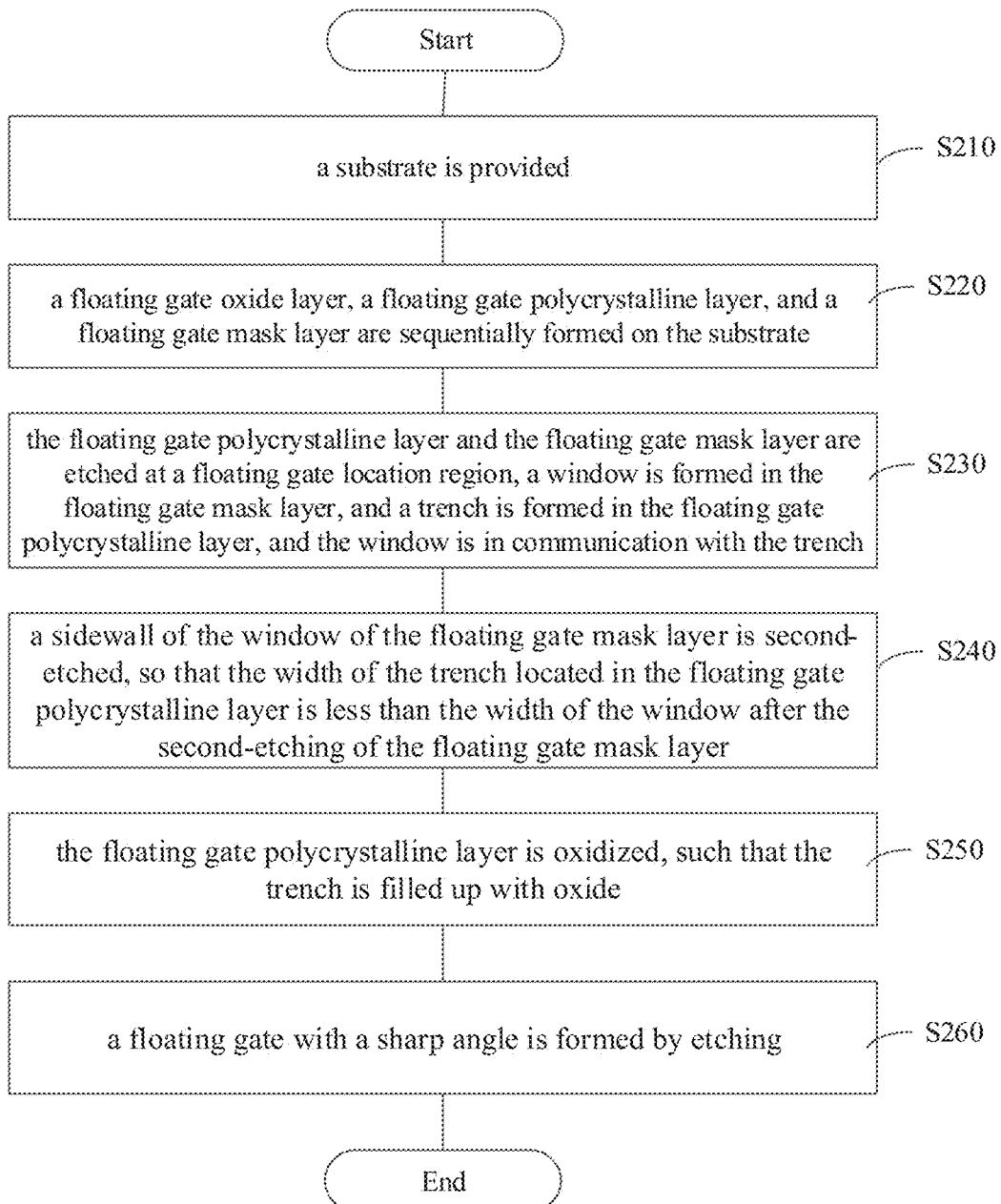
FIG. 2 is a flowchart of a method of manufacturing a flash memory device according to an embodiment.
Figure 3:
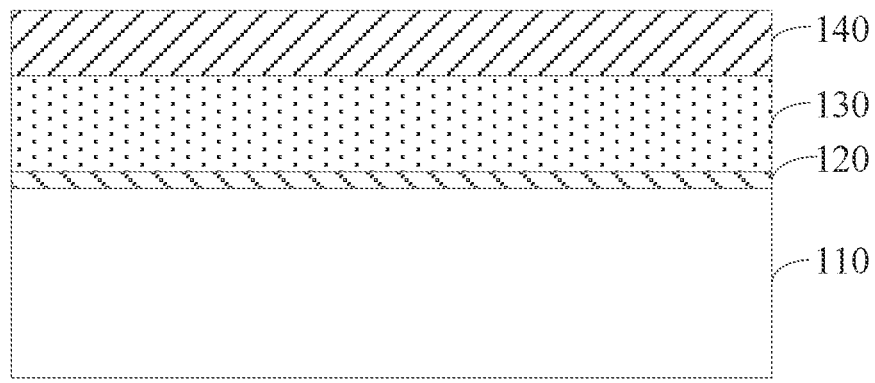
FIGS. 3-11 are schematic views of a floating gate during manufacturing.

Referring to FIG. 3, a substrate 110 is provided, which may be a silicon substrate, or a germanium, silicon germanium, silicon germanium, gallium arsenide substrate, which may also be a Silicon-On-Insulator (SOI) substrate, etc. When the tunneling carriers are electrons, a p-type doped well is formed in the substrate 110, which can be achieved by implanting boron ions. When the tunneling carriers are holes, an n-type doped well is formed in the substrate 110, which can be achieved by implanting phosphorus ions. In an embodiment, the substrate 110 is a base for preparing a floating gate, the floating gate of which is a component of a flash memory device, and since the flash memory device uses electrons as carriers, a p-type doped well is formed in the semiconductor substrate 110, the semiconductor substrate 110 serves as a platform for subsequently forming a flash memory device.

In step S220, a floating gate oxide layer, a floating gate polycrystalline layer, and a floating gate mask layer are sequentially formed on the substrate.

A floating gate oxide layer 120 is formed on the substrate 110. The material of the floating gate oxide layer 120 may be silicon oxide, silicon nitride, silicon oxynitride, or other high-k materials. In this embodiment, the floating gate oxide layer 120 is a silicon oxide layer. The floating gate oxide layer 120 may be formed by furnace thermal oxidation, Atomic Layer Deposition (ALD), Chemical Vapor deposition (CVD), Plasma Enhanced Chemical Vapor Deposition (PECVD) etc., in this embodiment, the furnace thermal oxidation is selected to form the floating gate oxide layer 120.

Polysilicon is deposited on the floating gate oxide layer 120 to form a first polysilicon layer, which serves as a floating gate polycrystalline layer 130 for preparing the floating gate. Silicon nitride is deposited on the polysilicon lager to form a silicon nitride layer, which serves as the floating gate mask layer 140.

Figure 4:
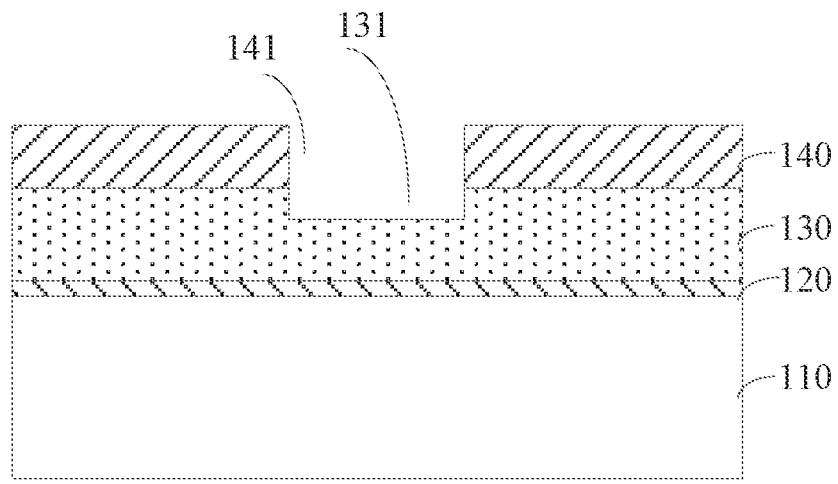

In step S230, the floating gate polycrystalline layer and the floating gate mask layer are etched at a floating gate location region, a window is formed in the floating gate mask layer, and a trench is formed in the floating gate polycrystalline layer, and the window is in communication with the trench. The width w of the trench is less than the width of the floating gate location region. The floating gate polycrystalline layer 130 and the floating gate mask layer 140 are etched by an etching process in a region where the floating gate is required to be formed, and a window 141 is formed on the floating gate mask layer 140 (silicon nitride layer) in the region where the floating gate is required to be formed. The etching continues in a direction the window 141 extends, and a trench 131 is formed on the floating gate polycrystalline layer 130 (polysilicon layer), see FIG. 4. The window 141 etched in the floating gate mask layer 140 is in communication with the trench 131 etched in the floating gate polycrystalline layer 130.

The etching processes for forming the window 141 in the floating gate mask layer 140, and forming the trench 131 in the floating gate polycrystalline layer 130 are both dry etching. Dry etching is a technique in which plasma is used in thin film etching. When the surface material is etched by dry etching, there are both isotropy in chemical reaction and anisotropy in physical reaction. Because of the unique way in which dry etching combines physical and chemical reactions, the size and shape of the pattern can be precisely controlled by the interaction of isotropy and anisotropy.

In an embodiment, the window 141 and the trench 131 of the same width are vertically etched in the floating gate polycrystalline layer 130 and the floating gate mask layer 140, by dry etching, that is, the window 141 is in communication with the trench 131, and the window 141 is coplanar with the sidewall of the trench 131.

Figure 12:
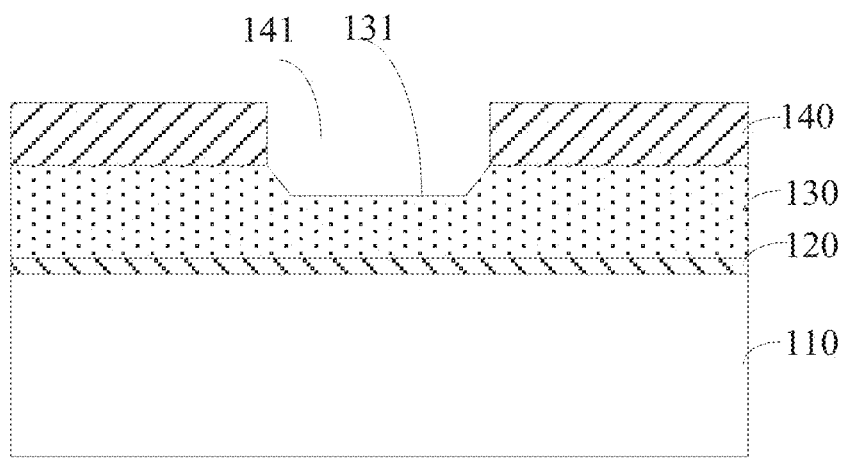
FIG. 12 is a schematic view of a window communicating with a trench according to another embodiment.

In an embodiment, the floating gate polycrystalline layer 130 and the floating gate mask layer 140 are dry etched, the window 141 is vertically etched at the floating gate location region of the floating gate mask layer 140, the trench 131 is non-vertically etched at the floating gate location region of the floating gate polycrystalline layer 130, and sidewalls of the trench 131 are inclined, see FIG. 12. Of course, the sidewalls of the trench 131 may also be curved.

Figure 5:
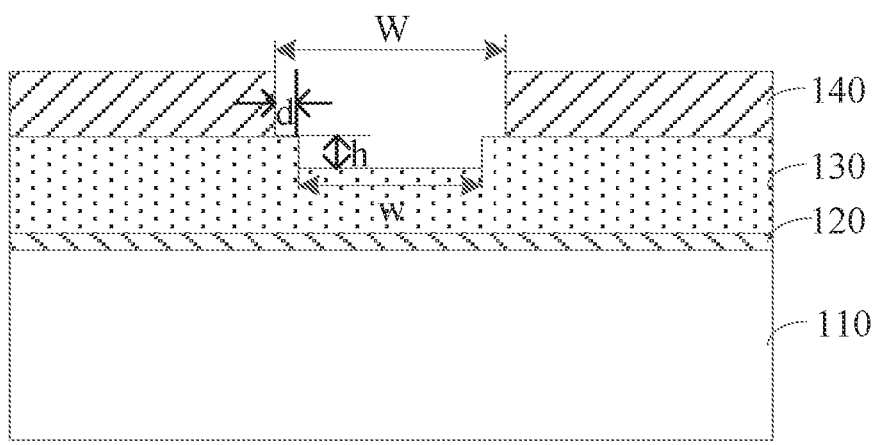

In step S240, a sidewall of the window 141 of the floating gate mask layer is second-etched, so that the width w of the trench located in the floating gate polycrystalline layer is less than the width W of the window after the second-etching of the floating gate mask layer, see FIG. 5. The width W of the window 141 after the second-etching is equal to the width of the floating gate region.

A second-etching is performed on the sidewall of the window 141 of the floating gate mask layer 140, and the etching width of the sidewall on one side of the window 141 is defined as the etching width d of the second-etching. The second-etching is performed by means of wet etch-back Wet etching is an etching approach in which the etched material is removed by a chemical reaction between a chemical etching solution and the material to be etched. Wet etching has the characteristics of strong adaptability and favorable surface uniformity. Only the sidewalls of the window 141 of the floating gate mask layer 140 are etched by the wet etch-back, and by controlling the amount of the wet etch-back, the width W of the window 141 after wet etch-back is greater than the width w of the trench 131 located in the floating gate polycrystalline layer 130.

Meanwhile, the use of wet etch-back will not affect the floating gate polycrystalline layer. After the sidewalls of the window 141 of the floating gate mask layer 140 are second-etched, the exposed floating gate polycrystalline layer 130 becomes stepped in shape. The depth of the floating gate polycrystalline layer 130 and the width of the sidewall of the window 141 of the floating gate mask layer 140 after being etched back serves as the base for subsequent oxidation of the exposed floating gate polycrystalline layer 130.

By reasonably configuring the etching depth of the trench 131 and the etch-back width of the window 141, a sharp angle of the floating gate manufactured subsequently can be maintained at 45 degrees to 50 degrees. In an embodiment, the ratio of the depth h of the trench to the etch width d of the second-etch ranges from 0.8 to 1.2. Alternatively, in an embodiment, the depth h of the trench 131 is equal to the etch width d of the second-etching.

In step S250, the floating gate polycrystalline layer is oxidized, such that the trench is filled up with oxide.

Figure 6:
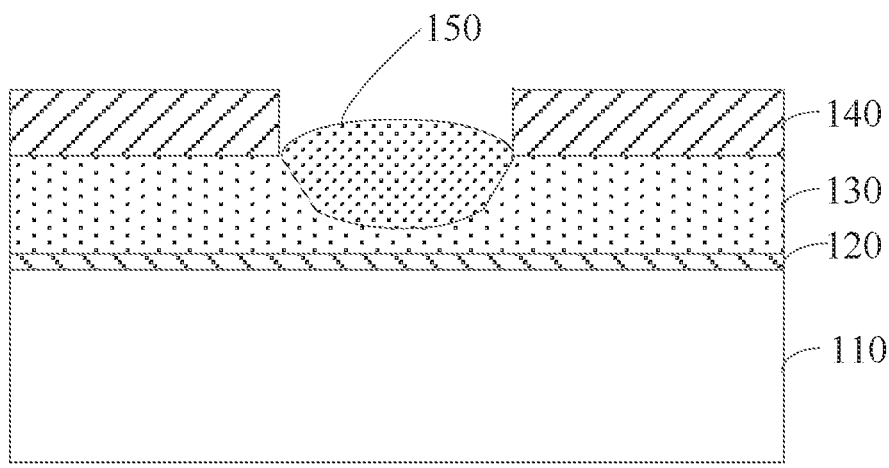

The exposed floating gate polycrystalline layer 130 at the step is subjected to an oxidation treatment so that its oxide fills up the trench 131. Since the floating gate polycrystalline layer 130 is formed by depositing polysilicon, the oxidation product of the polysilicon forms a field oxide layer 150 within the trench 131, see FIG. 6. Since the trench 131 in the floating gate polycrystalline layer 130 has a certain depth, and after the sidewalls of the window 141 of the floating gate mask layer 140 are second-etched, the width of the window 141 becomes greater, the exposed floating gate polycrystalline layer 130 becomes stepped in shape. During the oxidation process, the exposed floating gate polycrystalline layer 130 is oxidized along the window 141 and the trench 131. Since the oxidized thickness of the floating gate polycrystalline layer 130 is constant, the deeper the depth of the trench 131 in the floating gate polycrystalline layer 130, the further the region where the floating gate polycrystalline layer 130 is oxidized moves toward the floating gate oxide layer 120. Meanwhile, since the sidewall of the trench 131 and the sidewall of the window 141 form the step, during the oxidation of the floating gate polycrystalline lay 130 at the step, the exposed floating gate polycrystalline layer 130 is increased, the formation of the field oxide layer 150 is correspondingly increased. During the oxidation of the floating gate polycrystalline layer 130 at the step, the arc surface of the interface between the field oxide layer 150 and the floating gate polycrystalline layer 130 at the step is close to a plane. That is, on both sides of the floating gate location region, sharp angles ($\theta_1$, $\theta_2$) formed at the contact interface between the field oxide layer 150 and the floating gate polycrystalline layer 130 are relatively sharp. In this embodiment, the degree ($\theta_1$, $\theta_2$) of the sharp angles are 45 degrees.

In step S260, a floating gate with a sharp angle is formed by etching.

Figure 7:
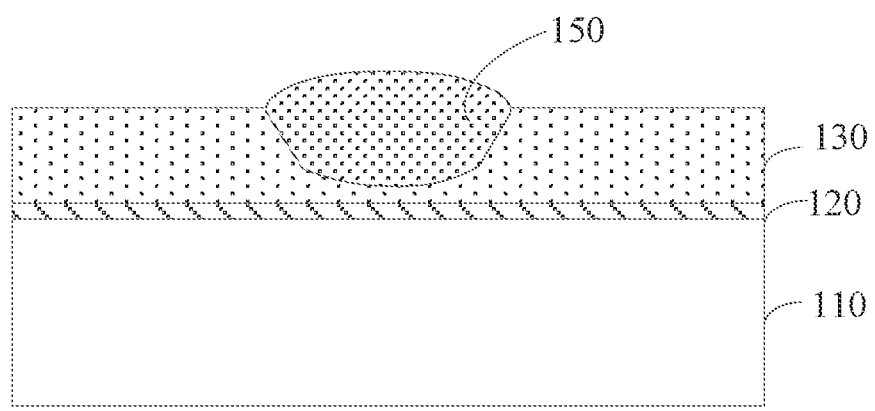
Figure 8:
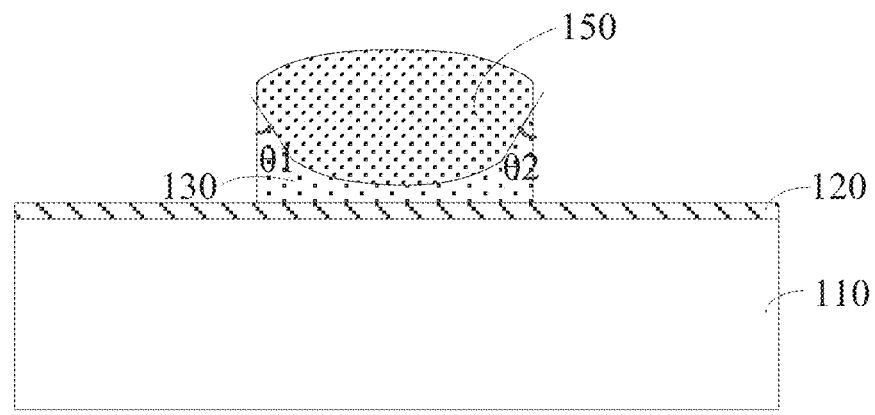

Wet chemical stripping is performed using hot phosphoric acid to remove the floating gate mask layer 140, see FIG. 7. Then, using the field oxide layer 150 formed by oxidizing the floating gate polycrystalline layer 130 as a mask, the floating gate polycrystalline layer 130 deposited outside the region of the field oxide layer 150 is removed by dry etching, thereby forming the floating gate with a sharp angle, see FIG. 8.

In an embodiment, the trench has a left-right symmetrical structure, and the degrees of the left sharp angle $\theta 1$ is the same as the degrees of the right sharp angle $\theta 2$.

By the described method, in the process of oxidizing the exposed floating gate polycrystalline layer to form the field oxide layer, the oxidation is performed along the trench and window. Since the sidewall of the trench and the sidewall of the window form a step, the exposed floating gate polycrystalline layer is increased, and the formation of the field oxide layer is correspondingly increased. During the oxidation of the floating gate polycrystalline layer at the step, the arc surface of the interface between the field oxide layer and the floating gate polycrystalline layer at the step is close to a plane. Meanwhile, the field oxide layer can be moved to the floating gate oxide layer due to the presence of the trench. That is, the contact interface between the field oxide layer and the floating gate polycrystalline layer forms sharp angles on both sides of the floating gate location region. In addition, in the process of etching and removing the floating gate polycrystalline layer located outside the floating gate location region, even if the formed floating gate position is offset for sure, the sharp angle of the floating gate is relatively stable and does not become obtuse, and the phenomenon of sharp-angle becoming obtuse is avoided.

By controlling the etch depth h of the trench and the etch-back width d of the wet-etched window, the degree of the sharp angle ($\theta 1$, $\theta 2$) is in the range of 45 degrees to 50 degrees, and can be stably maintained at the same degrees, thereby improving the speed and efficiency of the erasing and writing and enhancing the stability. In an embodiment, the method further includes the step of performing N-type doping to the floating gate.

In this embodiment, the floating gate polycrystalline layer 130 is a polysilicon layer, and the floating gate may be formed by chemical vapor deposition (CVD). After the polysilicon floating gate is formed, it may be doped. Since the tunneling carriers are electrons, the floating gate is N-type doped, and the doping ions may be pentavalent elements such as phosphorus, antimony, and arsenic.

In an embodiment, the method further includes the step of forming a tunneling oxide layer on the sidewalls of the floating gate.

Figure 9:
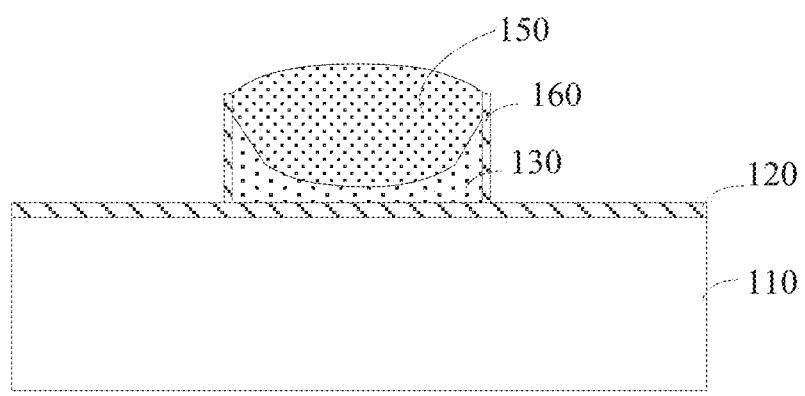

Silicon oxide is deposited on the floating gate to form a tunneling oxide layer 160, and the tunneling oxide layer 160 on the sidewalls of the floating gate is preserved by removing excess tunneling oxide layer 160 by etching, see FIG. 9. The tunneling oxide layer 160 may also be silicon nitride, silicon oxynitride, or other high-k materials. The tunneling oxide layer 160 may be formed by furnace thermal oxidation, atomic layer deposition (ALD), CVD, plasma enhanced chemical vapor deposition (PECVD) etc., in this embodiment, a tunneling oxide layer 160 is formed by furnace thermal oxidation.

In an embodiment, the method further includes the step of forming a control gate on the floating gate.

Figure 10:
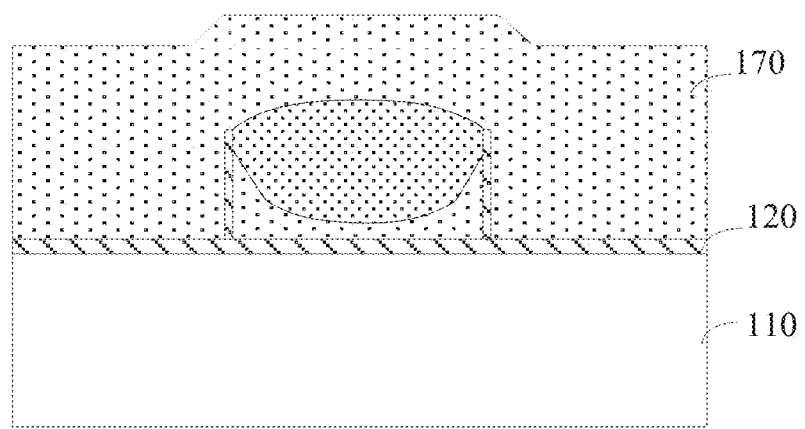
Figure 11:
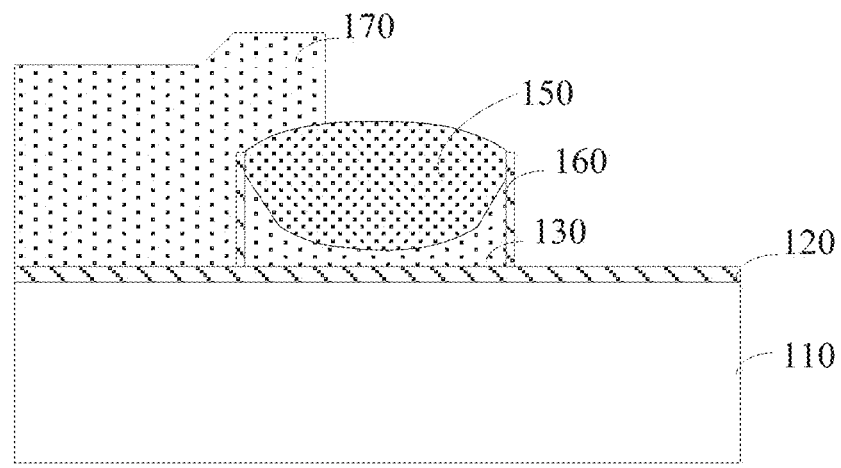

Polysilicon is deposited on the tunneling oxide layer 160 outside the floating gate and floating gate location regions to form a second polysilicon layer 170, see FIG. 10. A portion of the second polysilicon layer 170 is removed by photolithography to form the control gate, see FIG. 11.

The foregoing respective technical features involved in the respective embodiments can be combined arbitrarily, for brevity, not all possible combinations of the respective technical features in the foregoing embodiments are described, however, to the extent they have no collision with each other, the combination of the respective technical features shall be considered to be within the scope of the description.

The foregoing implementations are merely specific the embodiment of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A method of manufacturing a flash memory device, comprising:
   providing a substrate;
   forming a floating gate oxide layer, a floating gate polycrystalline layer, and a floating gate mask layer sequentially on the substrate;
   etching the floating gate polycrystalline layer and the floating gate mask layer at a floating gate location region, forming a window in the floating gate mask layer and forming a trench in the floating gate polycrystalline layer, wherein the window is in communication with the trench, and etching the floating gate polycrystalline layer and the floating gate mask layer at the floating gate location region includes vertically etching the floating gate polycrystalline layer and the floating gate mask layer in the floating gate location region, so that a width of the window formed after the vertically etching is the same as a width of the trench;
   second-etching a sidewall of the window of the floating gate mask layer, so that the width of the trench in the floating gate polycrystalline layer is less than the width of the window in the floating gate mask layer after the second-etching, and an exposed portion of the floating gate polycrystalline layer becomes stepped in shape;
   oxidizing the floating gate polycrystalline layer, such that the trench is filled up with oxide to form a field oxide layer; and
   etching to form a floating gate with a sharp angle, wherein a degree of the sharp angle is dependent on a ratio of a depth of the trench to an etch width of the second-etching.

2. The method of claim 1, wherein the ratio of the depth of the trench to the etch width of the second-etching ranges from 0.8 to 1.2.

3. The method of claim 2, wherein the depth of the trench is equal to the etch width of the second-etching.

4. The method of claim 1, wherein the sharp angle ranges from 45 degrees to 50 degrees.

5. The method of claim 1, wherein the etching of the floating gate polycrystalline layer and the floating gate mask layer at the floating gate location region comprises:
   vertically etching the floating gate polycrystalline layer and the floating gate mask layer in the floating gate location region by dry etching.

6. The method of claim 1, wherein the etching of the floating gate polycrystalline layer and the floating gate mask layer at the floating gate location region comprises:

vertically etching the floating gate location region of the floating gate mask layer by dry etching to form the window; and non-vertically etching the floating gate location region of the floating gate polycrystalline layer by dry etching to form the trench.

7. The method of claim 6, wherein a sidewall of the trench is an inclined or a curved surface.

8. The method of claim 1, wherein the sidewall of the window of the floating gate mask layer is second-etched by wet etching.

9. The method of claim 1, wherein the etching to form the floating gate with the sharp angle comprises:

removing the floating gate mask layer; and removing the floating gate polycrystalline layer located outside the floating gate location region by etching, and forming the floating gate with the sharp angle.

10. The method of claim 1, further comprising:

forming a tunneling oxide layer on both sides of the floating gate; and preserving the tunneling oxide layer on the floating gate sidewall by removing a portion of the tunneling oxide layer by etching.

11. The method of claim 10, further comprising:

forming a control gate on the floating gate, the field oxide layer, and the tunneling oxide layer.

12. The method of claim 1, further comprising the step of performing N-type doping to the floating gate.

* * * * *